United States Patent
Chin et al.

(10) Patent No.: US 11,139,287 B2
(45) Date of Patent: Oct. 5, 2021

(54) TRANSIENT VOLTAGE SUPPRESSION DEVICE WITH THERMAL CUTOFF

(71) Applicant: Littelfuse Semiconductor (WUXI) Co., Ltd., Wuxi (CN)

(72) Inventors: Chuanfang Chin, Taoyuan (TW); Kueir-Liang Lu, Chupeicity (TW); Lei Shi, Wuxi (CN); Tsungwen Mou, Chupeicity (TW)

(73) Assignee: Littefluse Semiconductor (WUXI) Co., Ltd., Wuxi (CN)

( * ) Notice: Subject to any disclaimer, the term of this patent is extended or adjusted under 35 U.S.C. 154(b) by 271 days.

(21) Appl. No.: 16/304,223

(22) PCT Filed: May 23, 2016

(86) PCT No.: PCT/CN2016/083012
§ 371 (c)(1),
(2) Date: Nov. 23, 2018

(87) PCT Pub. No.: WO2017/201656
PCT Pub. Date: Nov. 30, 2017

(65) Prior Publication Data
US 2020/0321327 A1 Oct. 8, 2020

(51) Int. Cl.
| | | |
|---|---|---|
| H01L 27/02 | (2006.01) | |
| H01L 23/525 | (2006.01) | |
| H02H 9/04 | (2006.01) | |
| H02H 1/04 | (2006.01) | |
| H02H 3/22 | (2006.01) | |

(52) U.S. Cl.
CPC ...... *H01L 27/0248* (2013.01); *H01L 23/5256* (2013.01); *H01L 27/02* (2013.01);
(Continued)

(58) Field of Classification Search
CPC ... H01L 27/02; H01L 23/525; H01L 27/0248; H01L 23/5256; H02H 9/04; H02H 9/042;
(Continued)

(56) References Cited

U.S. PATENT DOCUMENTS 3,575,645 A * 4/1971 Doversberger ......... H01L 23/34
257/173
3,700,969 A * 10/1972 Furnival ................. H01L 23/34
361/105
(Continued)

FOREIGN PATENT DOCUMENTS

| | | |
|---|---|---|
| CN | 201001034 Y | 1/2008 |
| CN | 201438458 U | 4/2010 |

(Continued)

OTHER PUBLICATIONS

International Search Report for the International Patent Application No. PCT/CN2016/083012, dated Feb. 23, 2017.

*Primary Examiner* — Danny Nguyen
(74) *Attorney, Agent, or Firm* — Kacvinsky Diasak Bluni PLLC (57) ABSTRACT

A transient voltage suppression (TVS) device including a TVS diode having a first electrode and a second electrode, an insulating plate disposed on the first electrode, a first terminal lead connected to the insulating plate, a second terminal lead connected to the second electrode, and an thermal cutoff element connecting the first terminal lead to the first electrode, the thermal cutoff element configured to melt and break an electrical connection between the first terminal lead and the first electrode when a temperature of the TVS diode exceeds a predetermined safety temperature.

12 Claims, 5 Drawing Sheets

(52) U.S. Cl.
CPC ........... *H02H 9/042* (2013.01); *H01L 23/525* (2013.01); *H02H 1/04* (2013.01); *H02H 3/22* (2013.01); *H02H 9/04* (2013.01)

(58) Field of Classification Search
CPC .. H02H 1/04; H02H 9/02; H02H 3/22; H02H 9/06
USPC .................................. 361/117–120, 103, 106
See application file for complete search history.

(56) References Cited

U.S. PATENT DOCUMENTS

| | | | | |
|---|---|---|---|---|
| 4,739,070 | A | * | 4/1988 | Orvik ................... C07D 213/61 |
| | | | | 546/345 |
| 10,148,079 | B2 | * | 12/2018 | Yang ..................... H01H 37/761 |
| 2004/0246645 | A1 | * | 12/2004 | Schilling ................. H04M 3/18 |
| | | | | 361/119 |
| 2007/0285865 | A1 | * | 12/2007 | McLoughlin ...... H01H 85/0241 |
| | | | | 361/118 |
| 2019/0115745 | A1 | * | 4/2019 | Finis ........................ H02H 1/04 |

FOREIGN PATENT DOCUMENTS

| | | | |
|---|---|---|---|
| CN | 102013293 | A | 4/2011 |
| CN | 102610658 | A | 7/2012 |
| CN | 104347565 | A | 2/2015 |
| CN | 2014165676 | U | 2/2015 |
| CN | 105556636 | A | 5/2016 |
| GB | 286739 | A1 * | 10/1988 |

\* cited by examiner

TRANSIENT VOLTAGE SUPPRESSION DEVICE WITH THERMAL CUTOFF

CROSS-REFERENCE TO RELATED APPLICATIONS

This application is a national phase claiming the benefit of and priority to International Patent Application No. PCT/CN2016/083012, entitled "TRANSIENT VOLTAGE SUPPRESSION DEVICE WITH THERMAL CUTOFF", filed May 23, 2016, the entire content of which is hereby incorporated by reference in its entirety.

FIELD OF THE DISCLOSURE

The present disclosure relates generally to the field of circuit protection devices, and relates more particularly to a transient voltage suppression device with a thermal cutoff feature.

FIELD OF THE DISCLOSURE

Transient voltage suppression (TVS) diodes, which are sometimes referred to as Zener diodes or avalanche diodes, are commonly employed in electronic circuits to protect devices against damage that could otherwise result from transient voltage signals. TVS diodes typically include a series of interconnected silicon dies that are grouped or stacked together. The number, size, arrangement, and composition of the silicon dies in a TVS diode dictates a voltage rating of the diode.

Under normal, non-transient operating conditions, a TVS diode is reverse biased. During transient conditions, however, a reverse bias voltage across a TVS diode will exceed a reverse breakdown voltage of the diode, causing the diode to clamp the transient voltage to the reverse breakdown voltage, thereby preventing the transient voltage from exceeding a maximum voltage that can be sustained by an electronic device that is electrically coupled to the diode.

A shortcoming associated with TVS diodes is that when a TVS diode is subjected to a transient voltage signal that exceeds the voltage rating of the diode, the diode may overheat and fail, which may result in a short in the diode. (Significant follow-on currents may then be allowed to flow through the shorted diode and may damage devices that are connected to the diode.)

It is with respect to these and other considerations that the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of a transient voltage suppression (TVS) device in accordance with the present disclosure may include a TVS diode having a first electrode and a second electrode, an insulating plate disposed on the first electrode, a first terminal lead connected to the insulating plate, a second terminal lead connected to the second electrode, and an thermal cutoff element connecting the first terminal lead to the first electrode, the thermal cutoff element configured to melt and break an electrical connection between the first terminal lead and the first electrode when a temperature of the TVS diode exceeds a predetermined safety temperature.

Another exemplary embodiment of a TVS device in accordance with the present disclosure may include a first TVS diode and a second TVS diode connected to one another by a thermal cutoff element, the thermal cutoff element configured to melt and break an electrical connection between the first TVS diode and the second TVS diode when a temperature of at least one of the first TVS diode and the second TVS diode exceeds a predetermined safety temperature, an insulating cuff surrounding the thermal cutoff element and defining a hollow interior chamber, a first terminal lead connected to an electrode of the first TVS diode, and a second terminal lead connected to an electrode of the second TVS diode.

Another exemplary embodiment of a TVS device in accordance with the present disclosure may include a TVS diode having a first electrode and a second electrode, a first terminal lead connected to the first electrode, a second terminal lead connected to the second electrode by a thermal cutoff element, the thermal cutoff element configured to melt and break an electrical connection between the second terminal lead and the second electrode when a temperature of the TVS diode exceeds a predetermined safety temperature, the TVS diode, the first terminal lead, and the second terminal lead disposed within a housing including a detent element restricting movement of the TVS diode in a direction of the second terminal lead; and a spring element held in compression between a portion of the housing and the second terminal lead, the spring element biasing the second terminal lead away from the second electrode.

DETAILED DESCRIPTION

Several embodiments of a transient voltage suppression (TVS) device in accordance with the present disclosure will now be described more fully with reference to the accompanying drawings, in which preferred embodiments of the TVS device are presented. The TVS device of the present disclosure may, however, be embodied in many different forms and should not be construed as being limited to the embodiments set forth herein. Rather, these embodiments are provided so that this disclosure will be thorough and complete, and will fully convey the scope of the TVS device to those skilled in the art. In the drawings, like numbers refer to like elements throughout unless otherwise noted.

Figures 1A, 1B, 1C:
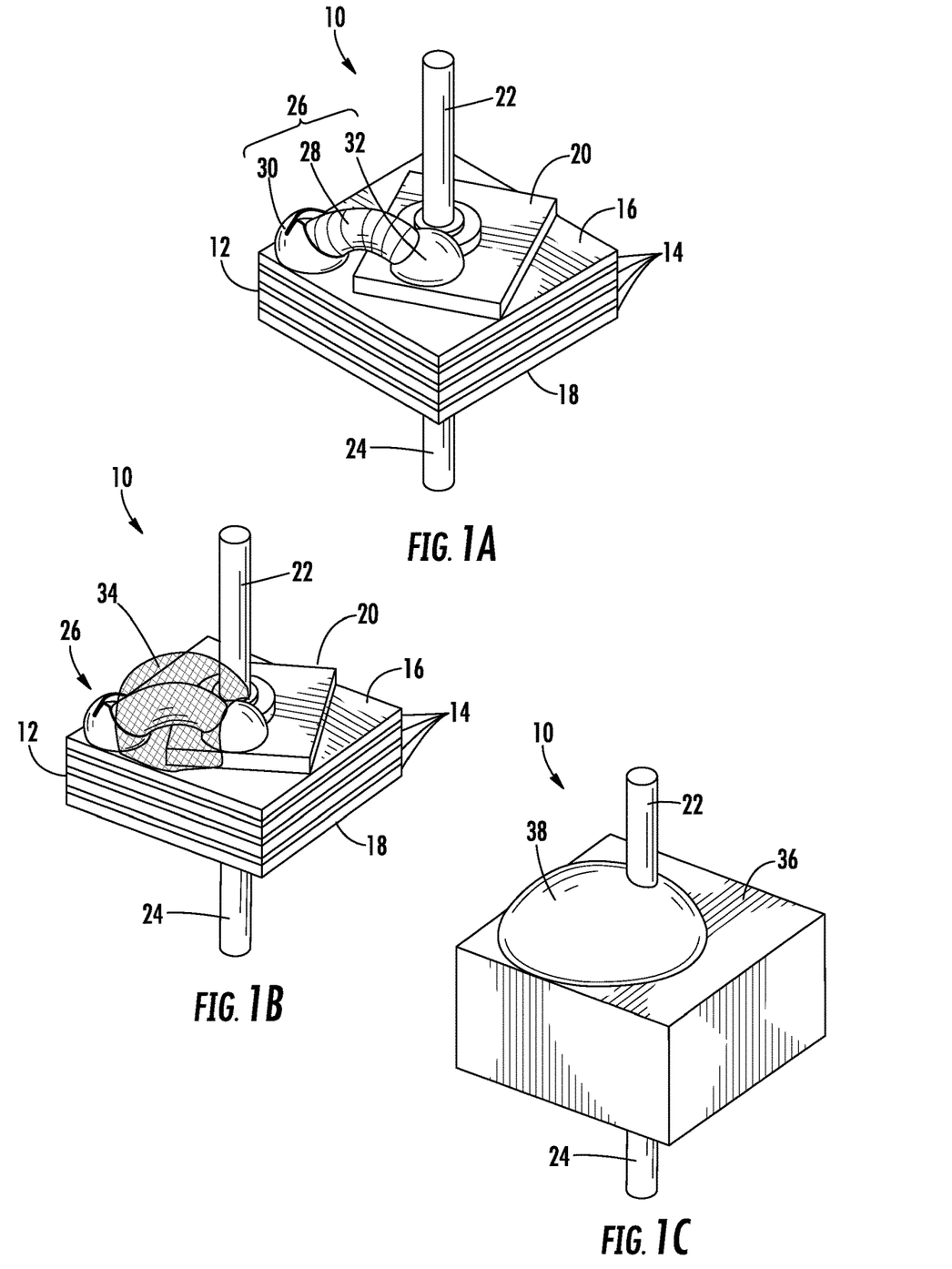
FIG. 1a is a perspective view illustrating an exemplary embodiment of a transient voltage suppression device in accordance with the present disclosure.
FIG. 1b is perspective view illustrating the transient voltage suppression device shown in FIG. 1a with a low temperature adhesive material covering a thermal cutoff element of the device.
FIG. 1c is a perspective view illustrating the transient voltage suppression device shown in FIG. 1a with an electrically insulating outer coating.

Referring now to FIGS. 1a-1c, a TVS device (hereinafter "the device 10") in accordance with an exemplary embodiment of the present disclosure is shown. As best shown in FIG. 1a, the device 10 may include a TVS diode 12 that is defined by a stack or group of interconnected silicon dies 14. The silicon dies 14 may define a first electrode 16 on a first, top side of the TVS diode 12 and a second electrode 18 on a second, bottom side of the TVS diode 12. During normal operation of the device 10, electrical current is allowed to flow through the TVS diode 12 between the first and second electrodes 16, 18 as described in greater detail below. As will be appreciated by those of ordinary skill in the art, the TVS diode 12 may have a reverse breakdown voltage and a voltage rating that are dictated by the number, size, arrangement, and composition of the silicon dies 14.

The device 10 may further include an insulating plate 20 disposed on the first electrode 16. The insulating plate 20 may be fastened or bonded to the first electrode 16 (e.g., with non-conductive adhesive), but this is not critical. The insulating plate 20 may be formed of any electrically insulating, heat resistant material, including, but not limited to, ceramic, glass, plastic, rubber, various composites, etc. An electrically conductive first terminal lead 22 may be connected to the insulating plate 20, such as with adhesive or other fastening means. An electrically conductive second terminal lead 24 may be connected directly to the second electrode 18 of the TVS diode 12 (i.e., with no insulating plate therebetween), such as with solder or conductive adhesive, to establish a direct electrical connection therewith. The first and second terminal leads 22, 24 may facilitate electrical connection of the device 10 to other devices within a circuit.

Still referring to FIG. 1a, the device 10 may further include a thermal cutoff element 26 disposed between the first terminal lead 22 and the first electrode 16 of the TVS diode 12. The thermal cutoff element 26 may include a fuse element 28 that is connected to the first terminal lead 22 and to the first electrode 16 by electrically conductive, low temperature joints 30, 32. The low temperature joints 30, 32 may be formed of low temperature conductive paste or low temperature solder, for example. The fuse element 28 and low temperature joints 30, 32 may have a melting temperature that is near, and preferably below, a predetermined "safety temperature" of the TVS diode 12. The "safety temperature" may be a maximum safe operating temperature of the TVS diode 12 above which the TVS diode 12 may fail and short. Thus, when the fuse element 28 and the low temperature joints 30, 32 are heated to temperatures approaching the safety temperature (e.g., by heat radiated from the TVS diode 12 during a transient condition), the fuse element 28 and the low temperature joints 30, 32 may melt, thereby breaking the conductive pathway between the first terminal lead 22 and the first electrode 16. The fuse element 28 may also have a current rating that corresponds to an overcurrent that will cause the fuse element 28 to melt and separate when the fuse element 28 is subjected to such an overcurrent (e.g., during a transient condition) in the manner of a conventional fuse.

Referring to FIG. 1b, a quantity of low temperature, non-conductive adhesive material 34 may be disposed on top of the thermal cutoff element 26 (the adhesive material 34 is not shown in FIG. 1a for the sake of clarity). In one non-limiting example, the adhesive material 34 may be hot-melt, though other low temperature, non-conductive adhesive materials are contemplated and may be similarly implemented without departing from the scope of the present disclosure. When the adhesive material 34 is solid (i.e., at temperatures below the melting temperature of the adhesive material 34) the adhesive material 34 may surround the thermal cutoff element 26 so that when the device 10 is encased in a protective, electrically insulating outer coating 36 (e.g., plastic) as shown in FIG. 1c, the outer coating 36 will define a domed or raised portion 38 that surrounds the thermal cutoff element 26. The adhesive material 34 may have a melting temperature that is near, and preferably below, the above-described safety temperature of the TVS diode 12. Thus, when the adhesive material is heated to temperatures that approach the safety temperature (e.g., by heat radiated from the TVS diode 12 during a transient condition), the adhesive material 34 may melt and may create an empty space within the raised portion 38 surrounding the thermal cutoff element 26.

When the fuse element 28 and the low temperature joints 30, 32 of the thermal cutoff element 26 melt, which may occur after, or at substantially the same time as, the melting of the adhesive material 34, and which may occur as a result of heat radiated from the TVS diode 12 during a transient condition and/or as a result of an overcurrent above the current rating of the fuse element 28 during a transient condition, the melted fuse element 28 and low temperature joints 30, 32 may flow or dissipate into the surrounding empty space evacuated by the melted adhesive material 34, thereby mitigating electrical arcing that might otherwise occur if the melted conductive components were confined to a tight space and not allowed to disperse.

During normal operation of the device 10, electrical current may be allowed to flow between the first and second terminal leads 22, 24, through the thermal cutoff element 26 and the TVS diode 12, and the TVS diode 12 may operate in a conventional manner to clamp voltages that exceed the reverse breakdown voltage of the TVS diode 12 in order to protect connected devices. However, if the voltage across the device 10 exceeds the voltage rating of the TVS diode 12, the temperature of the TVS diode 12 may increase above the safety temperature and the TVS diode 12 may radiate an amount of heat that causes the fuse element 28, the low temperature joints 30, 32, and the adhesive material 34 to be heated to their respective melting temperatures. Additionally, or alternatively, the current flowing through the fuse element 28 may exceed the current rating of the fuse element 28. Thus, the fuse element 28, the low temperature joints 30, 32, and the adhesive material 34 may melt and separate in the manner described above, thereby breaking the conductive pathway between the first terminal lead 22 and the first electrode 16 of the TVS diode 12. Thus, even if a transient overvoltage condition damages and shorts the TVS diode 12, follow-on currents are prevented from flowing through the device 10.

Figure 2A:
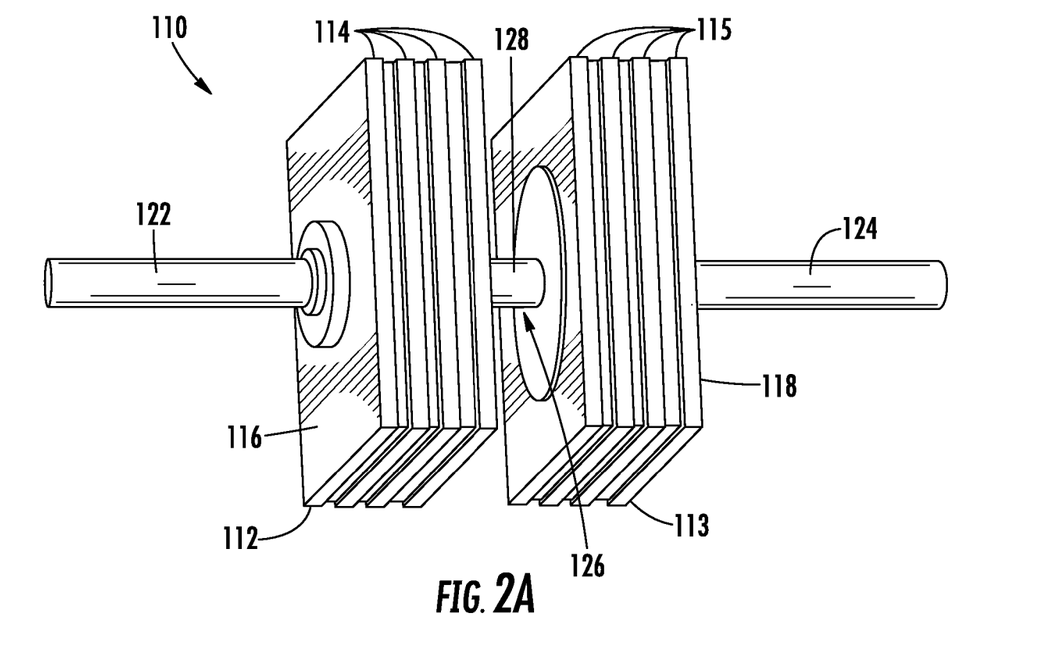
FIG. 2a is a perspective view illustrating another exemplary embodiment of a transient voltage suppression device in accordance with the present disclosure.

Referring now to FIGS. 2a-2d, a TVS device (hereinafter "the device 110") in accordance with another exemplary embodiment of the present disclosure is shown. As best shown in FIG. 2a, the device 110 may include first and second TVS diodes 112, 113 that are defined by respective stacks or groups of interconnected silicon dies 114, 115. The first and second TVS diodes 112, 113 may be electrically connected to one another in series by a thermal cutoff element 126 that may be, or may include, a fuse element 128 (described in greater detail below). As will be appreciated by those of ordinary skill in the art, the first and second TVS diodes 112, 113 may have respective reverse breakdown voltages and voltage ratings that are dictated by the number, size, arrangement, and composition of their respective silicon dies 114, 115.

The fuse element 128 may have a melting temperature that is near, and preferably below, predetermined "safety temperatures" of the TVS diodes 112, 113. The "safety temperatures" may be maximum safe operating temperatures of the TVS diodes 112, 113 above which the TVS diodes 112, 113 may fail and short. Thus, when the fuse element 128 is heated to a temperature approaching the safety temperatures (e.g., by heat radiated from one or both of the TVS diodes 112, 113 during a transient condition), the fuse element 128 may melt, thereby breaking the conductive pathway between the TVS diodes 112, 113. The safety temperatures of the TVS diodes 112, 113 may be the same or may be different. The fuse element 128 may also have a current rating that corresponds to an overcurrent that will cause the fuse element 128 to melt and separate when the fuse element 128 is subjected to such an overcurrent (e.g., during a transient condition) in the manner of a conventional fuse.

The device 110 may further include electrically conductive first and second terminal leads 122, 124 that may be connected to first and second electrodes 116, 118 of the first and second TVS diodes 112, 113, respectively, such as with solder or conductive adhesive, to establish direct electrical connections therewith. The first and second terminal leads 122, 124 may facilitate electrical connection of the device 110 to other devices within a circuit.

Figure 2B:
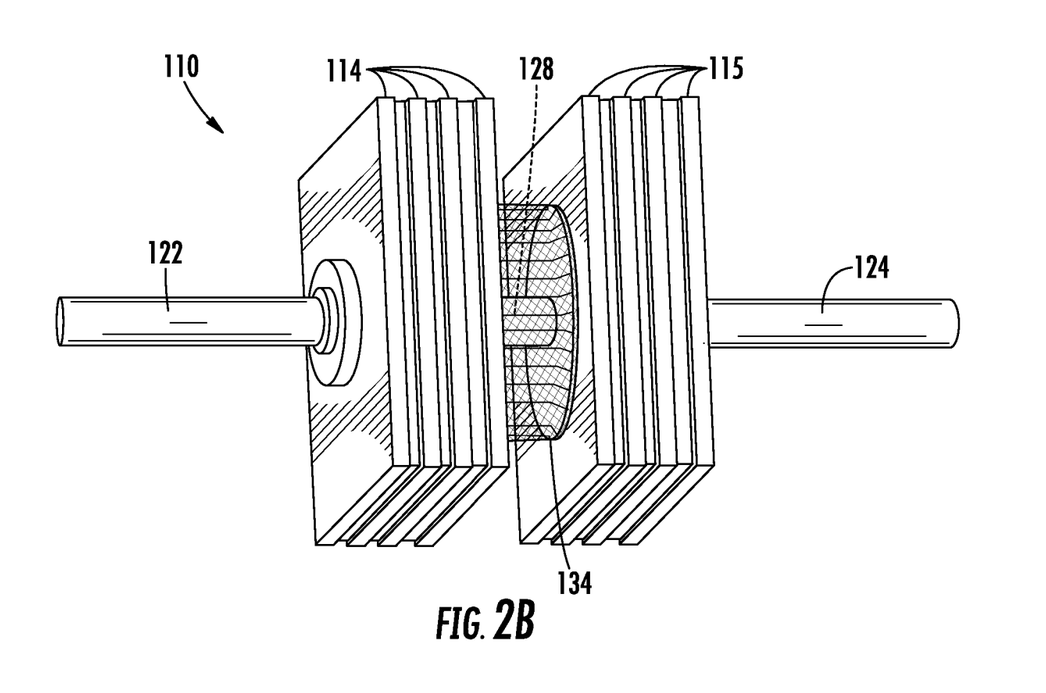
FIG. 2b is perspective view illustrating the transient voltage suppression device shown in FIG. 2a with an insulating cuff surrounding a thermal cutoff element of the device.

Referring now to FIG. 2b, the device 110 may further include an insulating cuff 134 (shown transparent) that surrounds the fuse element 128 of the thermal cutoff element 126 intermediate the TVS diodes 112, 113. The insulating cuff 134 may be formed of any electrically insulating, heat resistant material, including, but not limited to, ceramic, glass, plastic, rubber, various composites, etc. The insulating cuff 134 may define a hollow interior chamber 135 (FIG. 2c) that provides an empty, enclosed space radially surrounding the fuse element 128.

Figure 2C:
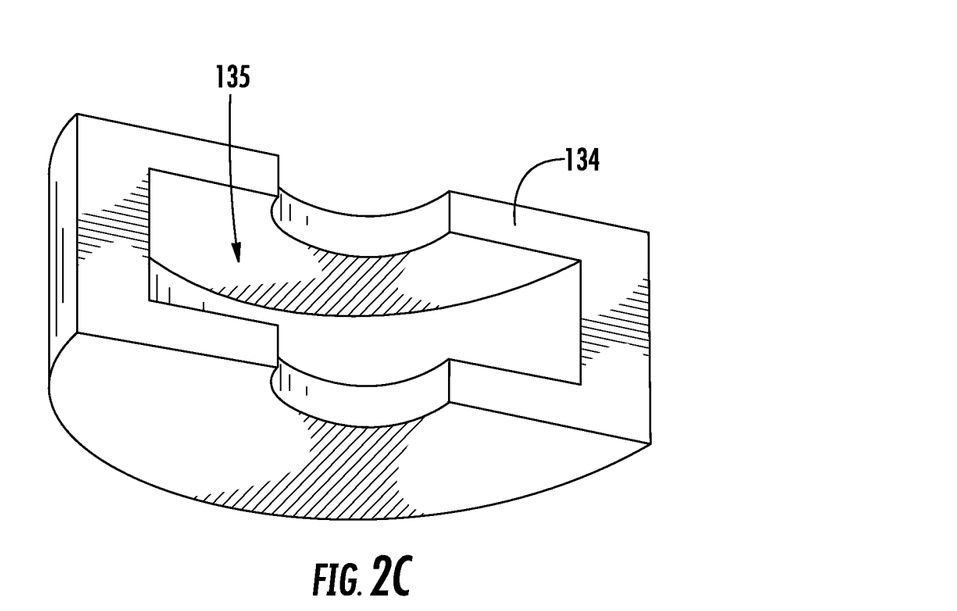
FIG. 2c is cross sectional detail view illustrating the insulating cuff shown in FIG. 2b.
Figure 2D:
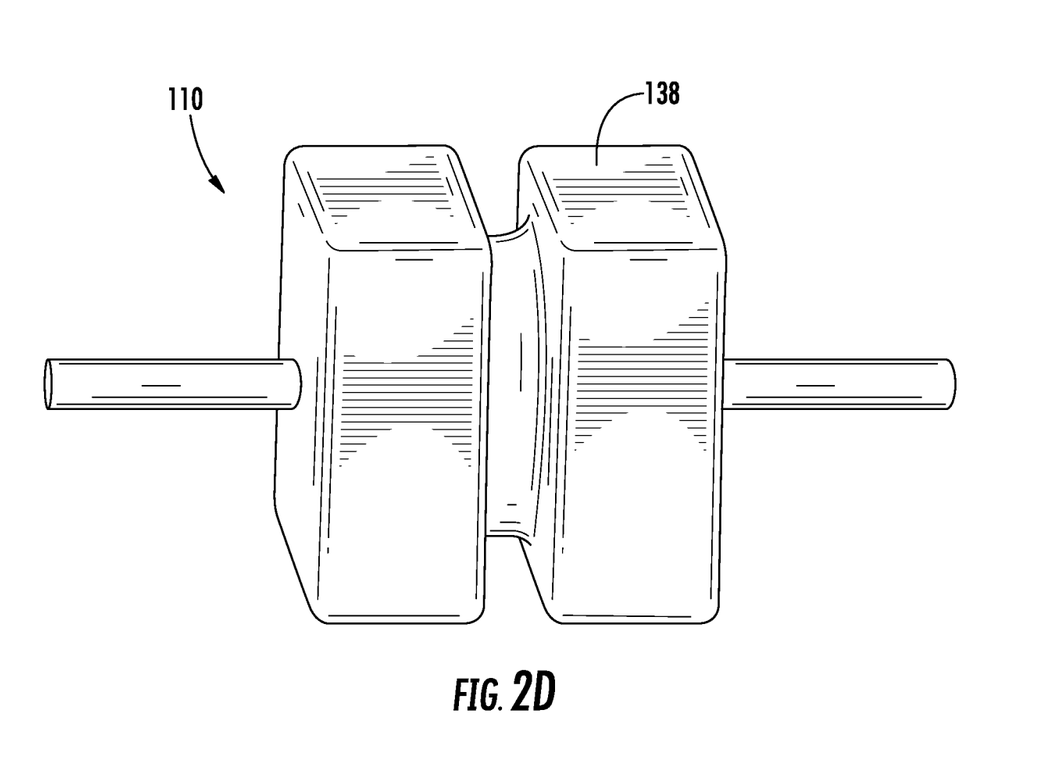
FIG. 2d is a perspective view illustrating the transient voltage suppression device shown in FIG. 2a with an electrically insulating outer coating.

When the fuse element 128 melts, which may occur as a result of heat radiated from the TVS diodes 112, 113 during a transient condition and/or as a result of an overcurrent above the current rating of the fuse element 128 during a transient condition, the melted fuse element 128 may flow or dissipate into the surrounding empty space provided by the interior chamber 135, thereby mitigating electrical arcing that might otherwise occur if the melted fuse element 128 were confined to a tight space and not allowed to disperse. Embodiments of the device 110 are contemplated in which the interior chamber 135 of the insulating cuff 134 may be filled with an arc-quenching material (e.g., sand) which may further aid in the mitigation of electrical arcing after melting of the fuse element 128. As shown in FIG. 2d, the TVS diodes 112, 113 and insulating cuff 134 may be covered with a protective, electrically insulating outer coating 138 (e.g., plastic).

During normal operation of the device 110, electrical current may be allowed to flow between the first and second terminal leads 122, 124, through the first and second TVS diodes 112, 113 and the thermal cutoff element 126, and the first and second TVS diodes 112, 113 may operate in a conventional manner to clamp voltages that exceed the reverse breakdown voltages of the first and second TVS diodes 112, 113 in order to protect connected devices. However, if the voltage across the device 110 exceeds the voltage rating of one or both of the first and second TVS diodes 112, 113, the temperature of one or both of the first and second TVS diodes 112, 113 may increase above their respective safety temperatures, causing one or both of the first and second TVS diodes 112, 113 to radiate an amount of heat that causes the fuse element 128 to be heated to its melting temperature. Additionally, or alternatively, the current flowing through the fuse element 128 may exceed the current rating of the fuse element 128. The fuse element 128 may therefore melt in the manner described above, thereby breaking the conductive pathway between the first and second TVS diodes 112, 113. Thus, even if a transient overvoltage condition damages and shorts the first and second TVS diodes 112, 113, follow-on currents are prevented from flowing through the device 110.

Figure 3A:
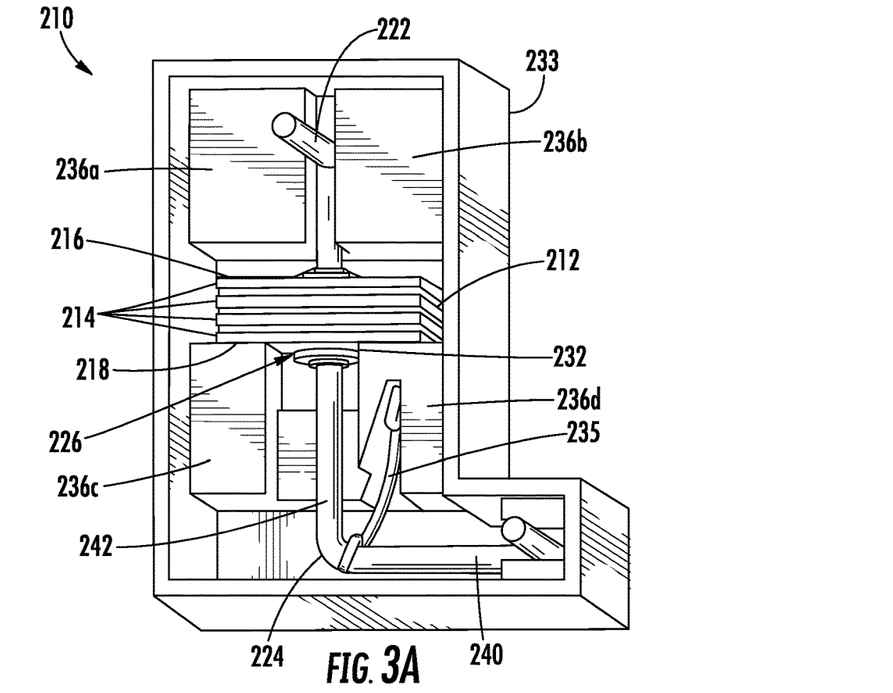
FIG. 3a is a perspective view illustrating another exemplary embodiment of a transient voltage suppression device in accordance with the present disclosure.
Figure 3B:
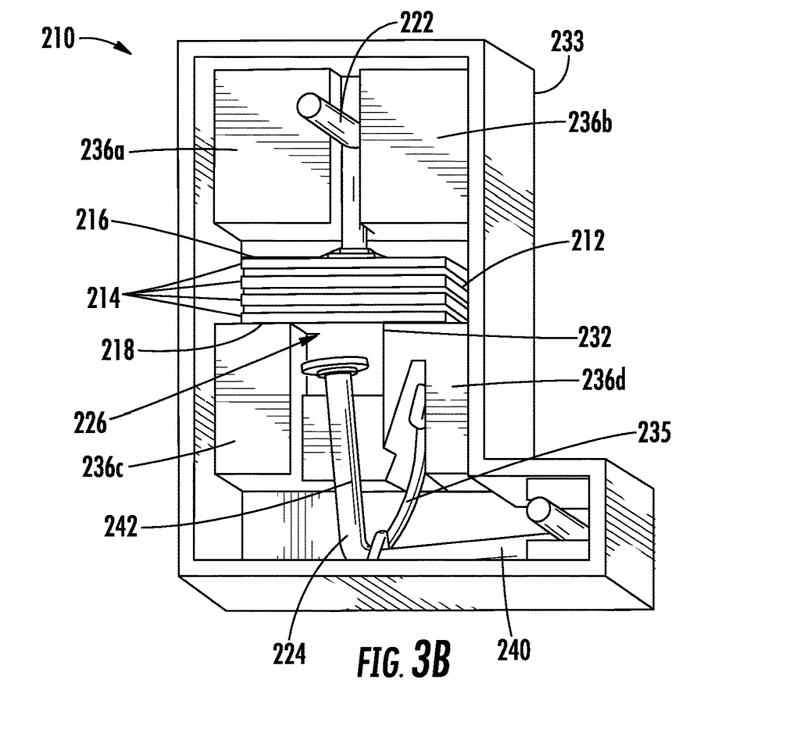
FIG. 3b is perspective view illustrating the transient voltage suppression device shown in FIG. 3a a thermal cutoff element of the device in an open state.
Figure 3C:
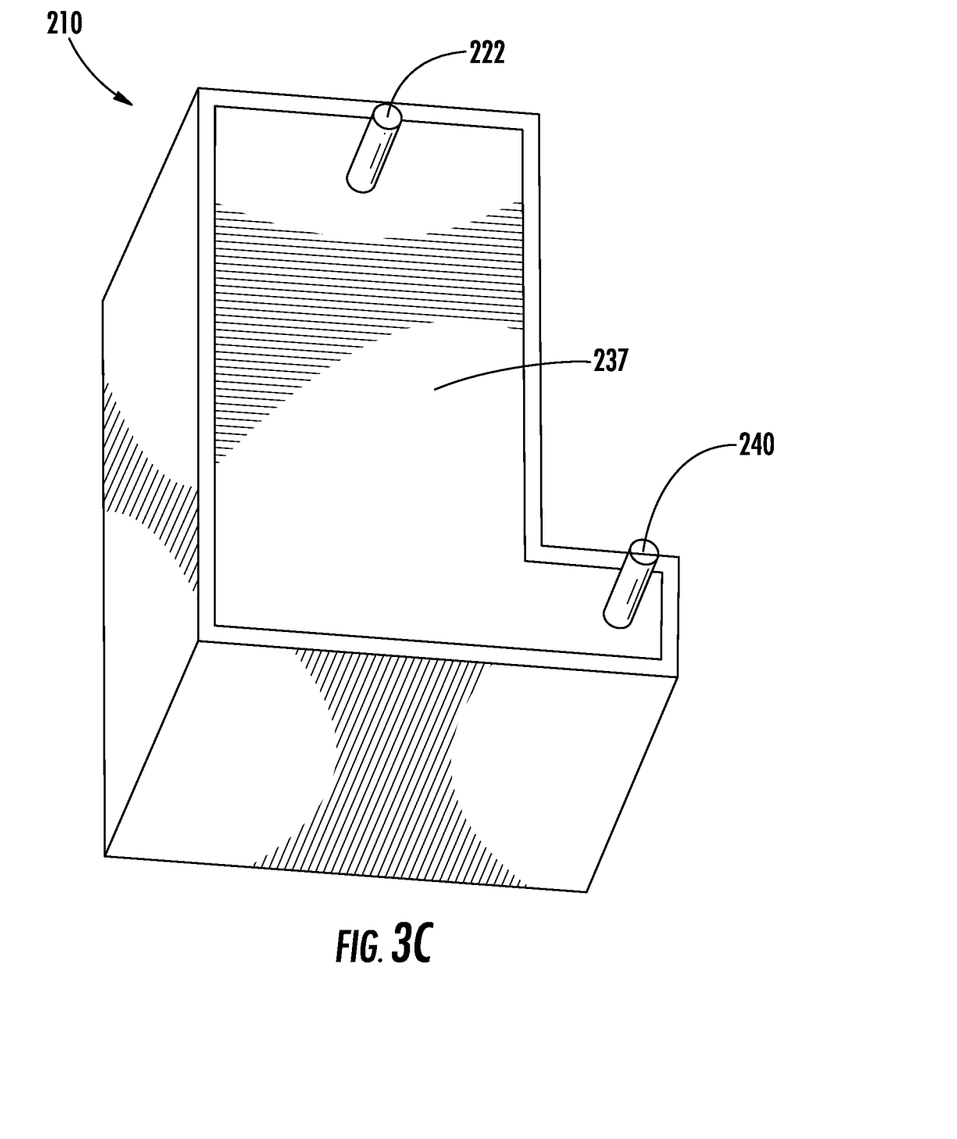
FIG. 3c is a perspective view illustrating the transient voltage suppression device shown in FIG. 3a with a housing of the device fully assembled.

Referring now to FIGS. 3a-3c, a TVS device (hereinafter "the device 210") in accordance with another exemplary embodiment of the present disclosure is shown. Referring to FIG. 3a, the device 210 may include a TVS diode 212 that is defined by a stack or group of interconnected silicon dies 214. The silicon dies 214 may define a first electrode 216 on a first, top side of the TVS diode 212 and a second electrode 218 on a second, bottom side of the TVS diode 212. During normal operation of the device 210, electrical current is allowed to flow through the TVS diode 212 between the first and second electrodes 216, 218 as described in greater detail below. As will be appreciated by those of ordinary skill in the art, the TVS diode 212 may have a reverse breakdown voltage and a voltage rating that are dictated by the number, size, arrangement, and composition of the silicon dies 214.

The device 210 may further include electrically conductive first and second terminal leads 222, 224 that may be electrically connected to the first and second electrodes 216, 218 of the TVS diode 212, respectively, to facilitate electrical connection of the device 210 to other devices within a circuit. The second terminal lead 224 may be connected to the second electrode 218 by a thermal cutoff element 226 which may be, or which may include, an electrically conductive, low temperature joint 232. The low temperature joint 232 may be formed of low temperature conductive paste or low temperature solder, for example. The low temperature joint 232 may have a melting temperature that is near, and preferably below, a predetermined "safety temperature" of the TVS diode 212. The "safety temperature" may be a maximum safe operating temperature of the TVS diode 212 above which the TVS diode 212 may fail and short. Thus, when the low temperature joint 232 is heated to a temperature approaching the safety temperature (e.g., by heat radiated from the TVS diode 212 during a transient condition), the low temperature joint 232 may melt and the conductive pathway through the device 210 may be broken as further described below.

The TVS diode 212 and the first and second terminal leads 222, 224 may be disposed within a protective, electrically insulating housing 233 that may be formed of plastic, for example. An epoxy mold compound or similar material may be applied to the device 210 to seal the interior of the device 210 and cured to define a front wall 237 (shown in FIG. 3c) of the housing 233 through which the first and second terminal leads 222, 224 protrude. The front wall 237 is omitted in FIGS. 3a and 3b for clarity. The housing 233 may include integral detent elements 236a-d that surround the TVS diode 212 and restrict movement of the TVS diode 212 in the directions of the first and second terminal leads 222, 224 (e.g., up and down as shown in FIG. 3a). The interior of the device 210, including the first and second terminal leads 222, 224 and the detent elements 236a-d, may be coated with a heat resistant material (e.g., silicon gel). The heat resistant material may thermally insulate the interior of the device 210 to protect devices surrounding the device 210 from heat that may be generated by the TVS diode 212 during a transient condition. The heat resistant material may additionally shield the TVS diode 212 against ion penetration. Still further, the heat resistant material, while relatively soft compared to the above-described epoxy mold compound after the epoxy mold compound has been cured, may provide physical support for the epoxy mold compound when the epoxy mold compound is applied in an uncured state, and may act as a buffer layer preventing the epoxy mold compound from enveloping and hardening around the second terminal lead 224. Since the heat resistant material is relatively soft compared to the cured epoxy mold compound, the second terminal lead 224 may be allowed to move within heat resistant material (as further described below) even though the second terminal lead 224 is surrounded by the heat resistant material.

Still referring to FIG. 3a, the device 210 may further include a spring element 235 which, during normal operation of the device 210, is held in compression between the interior of the housing 233 and a portion of the second terminal lead 224 in a manner that biases the second terminal lead 224 away from the second electrode 218 of the TVS diode 212. For example, as shown in FIG. 3a, the spring element 235 may be held in compression between the detent element 236d and a horizontally oriented portion 240 of the second terminal lead 224 that is bent at a 90 degree angle with respect to a vertically oriented portion 242 of the second terminal lead 224 that extends directly from the second electrode 218. When the low temperature joint 232 is solid (i.e., at low temperatures), the bond provided by the low temperature joint 232 may be strong enough to resist the force of the compressed spring element 235 and maintain an electrical connection between the second terminal lead 224 and the second electrode 218. However, when the low temperature joint 232 is melted, the bond may be broken and the spring element 235 may force the second terminal lead 224 to bend or flex away from the second electrode 218 as shown in FIG. 3b, thereby creating a substantial gap between the second terminal lead 224 and the second electrode 218 to mitigate electrical arcing that might otherwise occur if the second terminal lead 224 were left in close proximity to the second electrode 218 during a transient condition.

During normal operation of the device 210, electrical current may be allowed to flow between the first and second terminal leads 222, 224, through the TVS diode 212, and the TVS diode 212 may operate in a conventional manner to clamp voltages that exceed the reverse breakdown voltage of the TVS diode 212 in order to protect connected devices. However, if the voltage across the TVS diode 212 exceeds the voltage rating of the TVS diode 212, the temperature of the TVS diode 212 may increase above the safety temperature and the TVS diode 212 may radiate an amount of heat that causes the low temperature joint 232 to be heated to its melting temperature. The low temperature joint 232 may therefore melt, allowing the spring element 235 to move the second terminal lead 224 away from the second electrode 218 as described above, thereby breaking the conductive pathway between the through the device 210. Thus, even if a transient overvoltage condition damages and shorts the TVS diode 212, follow-on currents are prevented from flowing through the device 210.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A transient voltage suppression (TVS) device comprising:
   a first TVS diode and a second TVS diode connected to one another by a thermal cutoff element, the thermal cutoff element configured to melt and break an electrical connection between the first TVS diode and the second TINS diode when a temperature of at least one of the first TVS diode and the second TVS diode exceeds a predetermined safety temperature;
   an insulating cuff surrounding the thermal cutoff element and defining a hollow interior chamber;
   a first terminal lead connected to an electrode of the first TVS diode; and
   a second terminal lead connected to an electrode of the second TVS diode.

2. The TVS device of claim 1, wherein at least one of the first TVS diode and the second TINS diode comprises a stack of silicon dies.

3. The TVS device of claim 1, wherein the thermal cutoff element comprises a fuse element that is configured to separate when the fuse element is subjected to a current exceeding a current rating of the fuse element.

4. The TVS device of claim 1, further comprising an electrically insulating cuff disposed between the first TVS diode and second TVS diode and defining a hollow interior chamber surrounding the thermal cutoff element.

5. The TVS device of claim 1, further comprising an arc-quenching material disposed within the electrically insulating cuff.

6. The TVS device of claim 1, further comprising an electrically insulating outer coating encapsulating the first and second TVS diodes and the thermal cutoff element.

7. A transient voltage suppression (TVS) device comprising:
   a TVS diode having a first electrode and a second electrode;
   a first terminal lead connected to the first electrode;
   a second terminal lead connected to the second electrode by a thermal cutoff element, the thermal cutoff element configured to melt and break an electrical connection between the second terminal lead and the second electrode when a temperature of the TVS diode exceeds a predetermined safety temperature;
   the TVS diode, the first terminal lead, and the second terminal lead disposed within a housing comprising: a detent element restricting movement of the TVS diode in a direction of the second terminal lead; and a spring element held in compression between a portion of the housing and the second terminal lead, the spring element biasing the second terminal lead away from the second electrode.

8. The TVS device of claim 7, wherein the TVS diode comprises a stack of silicon dies.

9. The TVS device of claim 7, wherein the thermal cutoff element comprises a conductive adhesive.

10. The TVS device of claim 7, wherein an interior of the housing is coated with a heat-resistant material.

11. The TVS device of claim 10, wherein the heat-resistant material is silicon gel.

12. The TVS device of claim 7, wherein the spring element hears on a first portion of the second terminal lead that extends at an angle from a second portion of the second terminal lead that is connected to the second electrode.

* * * * *